(12) United States Patent
Wu

(10) Patent No.: US 7,486,567 B2
(45) Date of Patent: Feb. 3, 2009

(54) METHOD FOR HIGH SPEED PROGRAMMING OF A CHARGE TRAPPING MEMORY WITH AN ENHANCED CHARGE TRAPPING SITE

(75) Inventor: Chao-I Wu, Zhubei (TW)

(73) Assignee: Macronix International Co., Ltd, Hsinchu (TW)

( * ) Notice: Subject to any disclaimer, the term of this patent is extended or adjusted under 35 U.S.C. 154(b) by 106 days.

(21) Appl. No.: 11/741,917

(22) Filed: Apr. 30, 2007

(65) Prior Publication Data

US 2008/0266977 A1    Oct. 30, 2008

(51) Int. Cl.
  *G11C 11/34*   (2006.01)
  *G11C 16/06*   (2006.01)
(52) U.S. Cl. .......................... 365/185.28; 365/185.29; 365/185.24; 365/185.26
(58) Field of Classification Search ............ 365/185.28, 365/185.29, 185.24, 185.26
  See application file for complete search history.

(56) References Cited

U.S. PATENT DOCUMENTS

| 6,011,725 | A | 1/2000 | Eitan |
| 7,209,390 | B2 * | 4/2007 | Lue et al. ................ 365/185.19 |
| 7,345,920 | B2 * | 3/2008 | Yeh ........................ 365/185.21 |
| 7,400,538 | B2 * | 7/2008 | Pikhay et al. ............ 365/185.29 |

OTHER PUBLICATIONS

Lee, Ming-Hsiu et al., "AC-SONOS: a single-poly, assist-charge induced source-side-injection SONOS low power nonvolatile memory," Solid-State Device Research Conference, 2005. ESSDERC 2005. Proceedings of 35th European Sep. 12-16, 2005 pp. 505-508.
Van Houdt, J., et al. Analysis of the enhanced hot-electron injection in split-gate transistors useful for EEPROM applications Electron Devices, IEEE Transactions on vol. 39, Issue 5, May 1992 pp. 1150-1156.
Yeh, et al., "PHINES: a novel low power program/erase, small pitch, 2-bit per cell flash memory" Electron Devices Meeting, 2002. IEDM '02. Digest. International Dec. 8-11, 2002 pp. 931-934.

* cited by examiner

*Primary Examiner*—Anh Phung
*Assistant Examiner*—Toan Le
(74) *Attorney, Agent, or Firm*—Kenta Suzue; Haynes Beffel & Wolfeld LLP

(57) ABSTRACT

A method of high speed programming and erasing of a charge trapping memory using turn-on-mode assist-charge (TOM-AC) operations. The charge trapping memory includes a charge trapping structure overlying a substrate body with source and drain regions. The charge trapping structure includes a charge trapping layer overlying a dielectric layer. The charge trapping layer has an assist charge site (also referred to as AC-site, AC-side, or a first charge trapping site) and a data site (also referred to as data-side or a second charge trapping site). Initially, to place the charge trapping memory cell in a TOM operation, both the AC-site and the data site of the charge trapping memory cell are erased to a negative threshold voltage level, $-V_t$, by FN injection, thereby inducing a hole charge induced channel between the source and drain regions.

23 Claims, 7 Drawing Sheets

METHOD FOR HIGH SPEED PROGRAMMING OF A CHARGE TRAPPING MEMORY WITH AN ENHANCED CHARGE TRAPPING SITE

BACKGROUND OF THE INVENTION

1. Field of the Invention

The present invention relates generally to electrically programmable and erasable memory and more particularly to charge storage devices for monitoring charging effect.

2. Description of Related Art

Electrically programmable and erasable nonvolatile memory technologies based on charge storage structures known as Electrically Erasable Programmable Read-Only Memory (EEPROM) and flash memory are used in a variety of modern applications. A flash memory is designed with an array of memory cells that can be independently programmed and read. Sense amplifiers in a flash memory are used to determine the data value or values stored in a nonvolatile memory. In a typical sensing scheme, an electrical current through the memory cell being sensed is compared to a reference current by a current sense amplifier.

A number of memory cell structures are used for EEPROM and flash memory. As the dimensions of integrated circuits shrink, greater interest is arising in memory cell structures based on charge trapping dielectric layers, because of the scalability and simplicity of the manufacturing processes. Memory cell structures based on charge trapping dielectric layers include structures known as N-bit memory. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

N-bit devices use a relatively thick bottom oxide, e.g. greater than 3 nanometers, and typically about 5 to 9 nanometers, to prevent charge loss. Instead of direct tunneling, band-to-band tunneling induced hot hole injection BTBTHH can be used to erase the cell. However, the hot hole injection causes oxide damage, leading to charge loss in the high threshold cell and charge gain in the low threshold cell. Moreover, the erasing time must be increased gradually during program and erase cycling due to the hard-to-erase accumulation of charge in the charge trapping structure. This accumulation of charge occurs because the hole injection point and the electron injection point do not coincide with each other, and some electrons remain after the erase pulse. In addition, during the sector erase of an N-bit flash memory device, the erasing speed for each cell is different because of process variations (such as channel length variation). This difference in erasing speed results in a large Vt distribution of the erase state, where some of the cells become hard to erase and some of them are over-erased. Thus the target threshold Vt window is closed after many program and erase cycles and poor endurance is observed. This phenomenon will become a more serious problem as the technology continues to be scaled down.

A traditional floating gate device stores 1 bit of charge in a conductive floating gate. N-bit devices have a plurality of cells where each N-bit cell provides two bits of flash cells that store charge in an Oxide-Nitride-Oxide (ONO) dielectric. In a typical structure of an N-bit memory cell, a nitride layer is used as a trapping material positioned between a top oxide layer and a bottom oxide layer. The ONO layer structure effectively replaces the gate dielectric in floating gate devices. The charge in the ONO dielectric with a nitrite layer may be either trapped on the left side or the right side of an N-bit cell.

Conventional program and erase techniques employ a channel hot electron method for programming and a band-to-band tunneling induced hot hole method for erasing. It is desirable to provide more efficient methods for programming and erasing nonvolatile memory.

SUMMARY OF THE INVENTION

A method of high-speed programming and erasing of a charge trapping memory with turn-on-mode assist-charge (TOM-AC) operations is described. The charge trapping memory includes a charge trapping structure overlying a substrate body with source and drain regions. The charge trapping structure includes a charge trapping layer overlying a dielectric layer. The charge trapping layer has an "assist charge site" (also referred to as AC-site, AC-side, or a first charge trapping site) and a data site (also referred to as data-side or a second charge trapping site). Initially, to place the charge trapping memory cell in a TOM operation, both the AC-site and the data site of the charge trapping memory cell are erased to a negative threshold voltage level, $-Vt$, by FN injection, thereby inducing a hole charge induced channel between the source and drain regions. The hole charged induced channel can be viewed as having a first channel section adjacent to the source region and a second channel section adjacent to the drain section.

Second, the AC-site of the charge trapping memory cell is programmed to a high voltage threshold level ("high-Vt") with permanent charges using a channel hot electron technique. Electron charges on the AC-site of the charge trapping layer of the charge trapping memory cell are permanently programmed. Having a high voltage threshold level on the AC-site and a negative voltage threshold level on the data site creates a voltage differential between the AC-site and the data site. The effective gate voltage, also referred to as a gate over-drive voltage, $V_{g\_od}$, is the difference between the gate voltage Vg and a threshold voltage Vt on the AC-site, represented mathematically as $V_{g\_od}=V_g-V_t$.

The data site of the charge trapping memory cell is not programmed at this juncture. The data site remains at a negative voltage threshold level, $-Vt$. The programming of the AC-site causes the first channel section adjacent to the source region to turn off. The second channel section adjacent to the drain region remains turned on. The turning off of the first channel section and the second channel section remaining in a turned-on state creates a large abrupt electrical field region between adjoining sides of the first channel section and the second channel section. Electron charges on the AC-site enhance the speed in subsequent program and erase operations of the data site.

Third, after the AC-site has been programmed to a high voltage threshold state, the charge trapping memory cell undergoes program and erase operations. The charge trapping memory cell is programmed on the data site for storing data by a hot electron program technique, including a channel hot electron program technique and a source side injection technique. The hot electron program technique is used to inject charges into the data site of the charge trapping layer. The program current on the AC-site is limited due to the voltage differential between the high threshold voltage Vt on the AC-site and the negative threshold voltage on the data site. To put it another way, the program current on the AC-site is limited due to a large abrupt electrical field region between the first channel section that is in an off-state and the second channel section that is in an on-state.

Fourth, the charge trapping memory cell is erased using band-to-band tunneling induced hot hole injection. The erase operation of the charge trapping cell causes holes to be injected into the data site of the charge trapping layer. A negative gate voltage is applied to a polygate layer of the charge trapping layer and a positive drain voltage is supplied to the drain region of the charge trapping memory cell.

Broadly stated, a method for programming a charge trapping memory having a plurality of charge trapping memory cells, each memory cell having a first charge trapping site, a second charge trapping site, a source region and a drain region, comprises erasing the first charge trapping site and the second charge trapping site in each charge trapping memory cell to a negative voltage threshold level by FN injection; and programming the first charge trapping site to a high voltage threshold level with permanent charges in each charge trapping memory cell to a high voltage threshold, the second charge trapping site in each charge trapping memory cell remaining in the negative voltage threshold level; wherein the first charge trapping site in each charge trapping memory cell is not available for storing information and the second charge trapping site in each charge trapping memory cell is available for storing information.

The structures and methods of the present invention are disclosed in the detailed description below. This summary does not purport to define the invention. The invention is defined by the claims. These and other embodiments, features, aspects, and advantages of the invention will become better understood when read in conjunction with the following description, appended claims and accompanying drawings.

BRIEF DESCRIPTION OF THE DRAWINGS

The invention will be described with respect to specific embodiments thereof, and reference will be made to the drawings, in which.

DETAILED DESCRIPTION

Figure 1:
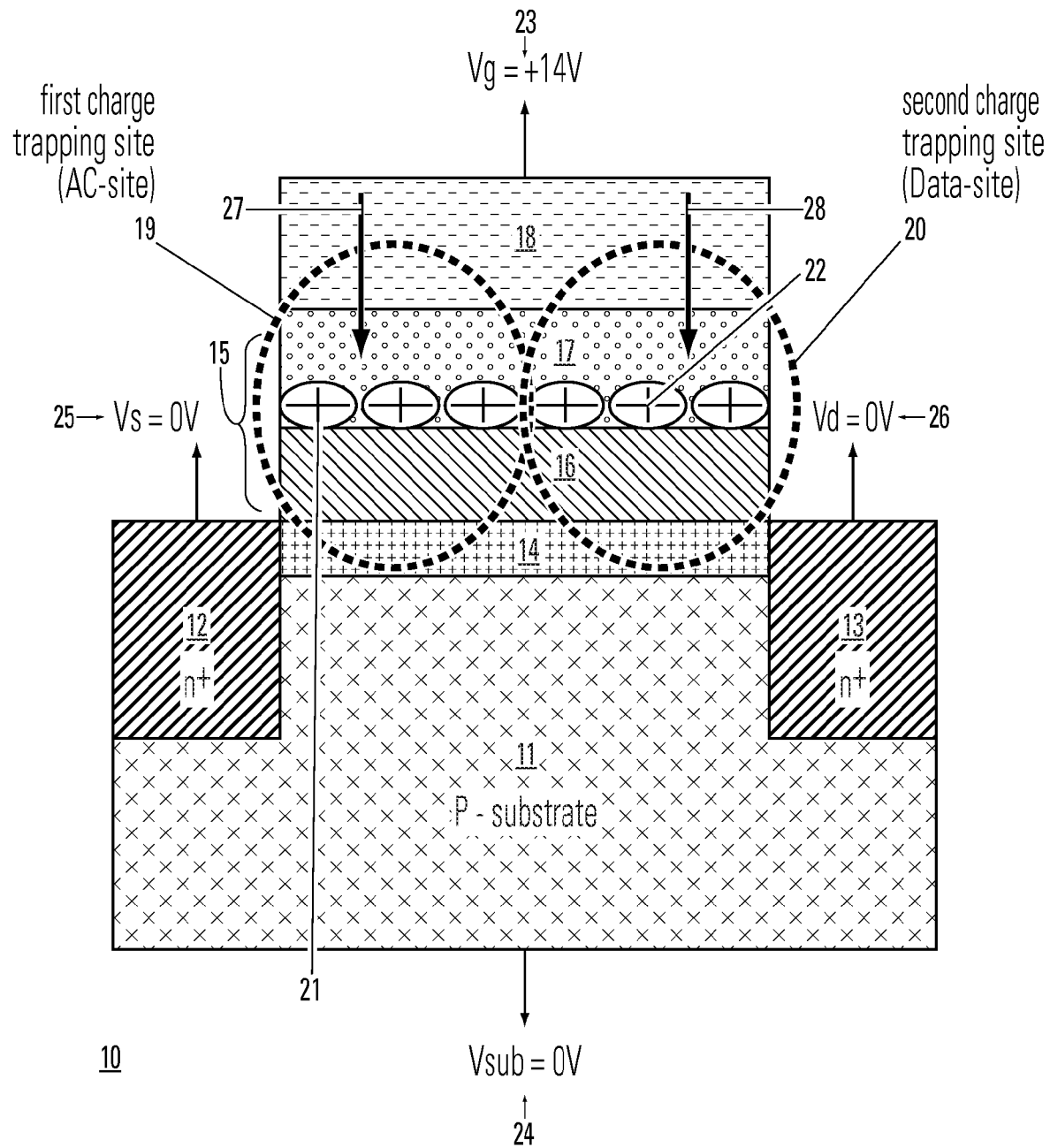
FIG. 1 is a process diagram illustrating a cross-sectional view of a charge trapping memory cell with an erase operation using FN injection on both AC-site and data site in accordance with the present invention.

A description of structural embodiments and methods of the present invention is provided with reference to FIGS. 1-7B. It is to be understood that there is no intention of limiting the invention to the specifically disclosed embodiments. Rather, the invention may be practiced using other features, elements, methods and embodiments. Like elements in various embodiments are commonly referred to with like reference numerals.

FIG. 1 is a process diagram illustrating a cross-sectional view of a charge trapping memory cell (or N-bit) with an erase operation by FN injection on both the AC-site and the data site. The charge trapping memory cell 10 comprises a p-substrate 11 with n+ doped regions 12 and 13 (source and drain regions), and a hole charge induced channel 14 between the n+ doped region 12 and the n+ doped region 13. A charge trapping structure 15 overlies a top surface of the hole charge induced channel 14. The illustration shows the structure and operation of one charge trapping memory cell. The present technology is applicable to a charge trapping memory having a plurality of charge trapping memory cells, such as a charge trapping memory array with columns and rows of charge trapping memory cells.

The charge trapping structure 15 in this embodiment includes a charge trapping layer 17 (e.g., silicon nitride layer) overlying a dielectric layer 16 (e.g., an oxide layer). Other embodiments of the charge trapping structure 15 comprise an ONO (oxide-nitride-oxide, or top dielectric-nitride-bottom dielectric) structure or an ON (oxide-nitride) structure. A polygate 18 overlies the charge trapping layer 17. The combination of the dielectric layer 16 and the charge trapping structure 17 is commonly referred as an NO (nitride-oxide) structure. The width of the NO structure, typically but not necessarily, aligns with the width of the channel 14.

The charge trapping memory cell 10 comprises a first charge trapping site 19, such as on the left side of the charge trapping structure 17, for storing one or more bits, and a second charge trapping site 20 in the charge trapping structure 17, such as on the right side of the charge trapping structure 17 for storing one or more bits. Representative top dielectrics include silicon dioxide and silicon oxynitride, or other similar high dielectric constant materials including for example $Al_2O_3$, having a thickness of about 5 to 10 nanometers. Representative bottom dielectrics include silicon dioxide and silicon oxynitride, or other similar high dielectric constant materials, having a thickness of about 3 to 10 nanometers. Representative charge trapping structures include silicon nitride or other similar high dielectric constant materials, including metal oxides such as $Al_2O_3$, $HfO_2$, $CeO_2$, and others, having a thickness of about 3 to 9 nanometers. The charge trapping structure may be a discontinuous set of pockets or particles of charge trapping material, or a continuous layer as shown in the drawing.

The term "AC-site" refers to a charge trapping site, such as a first charge trapping site, of the charge trapping layer 17 charged to a high voltage threshold (high-Vt) state, which increases or retains the programming speed. The first charge trapping site is permanently charged (or programmed) to a high-Vt state.

One of the charge trapping sites is selected to be an assisted-charge site for storing charges. In this embodiment, the first trapping site is selected as the assisted-charge site, while the other site, i.e. the second charge trapping site, is selected as a data site for storing data.

The memory cell for N-bit-like cells has, for example, a bottom oxide with a thickness ranging from 3 nanometers to 10 nanometers, a charge trapping layer with a thickness ranging from 3 nanometers to 9 nanometers, and a top oxide with a thickness ranging from 5 nanometers to 10 nanometers. The memory cell for SONOS-like cells has, for example, a bottom oxide with a thickness ranging from 1 nanometer to 3 nanometers, a charge trapping layer with a thickness ranging from 3 nanometers to 9 nanometers, and a top oxide with a thickness ranging from 3 nanometers to 10 nanometers.

As generally used herein, programming refers to raising the threshold voltage of a memory cell and erasing refers to lowering the threshold voltage of a memory cell. However, the invention encompasses both products and methods where programming refers to raising the threshold voltage of a memory cell and erasing refers to lowering the threshold voltage of a memory cell, and products and methods where programming refers to lowering the threshold voltage of a memory cell and erase refers to raising the threshold voltage of a memory cell.

The charge trapping memory cell 100 is erased to either a negative voltage level or to a voltage level that is less than the initial voltage threshold level, using what are referred to as turn-on mode (TOM) methods. The two erasing methods can be implemented either before a programming step (i.e., a pre-program erase operation), or after a programming step (i.e., a post-program erase operation). For additional information on TOM operations, see U.S. patent application Ser. No. 11/425,553 entitled "Bottom Dielectric Structures and High-K Memory Structures in Memory Devices and Methods for Expanding a Second Bit Operation Window," filed on Jun. 21, 2006, owned by the assignee of this application.

In this embodiment, the charge trapping memory cell 100 is erased to a negative voltage threshold level, $-V_t$, by FN injection, by applying a positive gate voltage Vg 23 of 14 volts, a substrate voltage Vsub 24 of 0 volts, a source voltage 25 of 0 volts, and a drain voltage Vd 26 of 0 volts. The negative voltage threshold $-V_t$ induces the hole charge induced channel 14 in a turn-on-mode operation. Holes 21 are tunneled in a direction 27 from the polygate 18 to the charge trapping layer 17 to the first trapping site 19, and holes 22 are tunneled in a direction 28 from the polygate 18 to the charge trapping layer 17.

Figure 2:
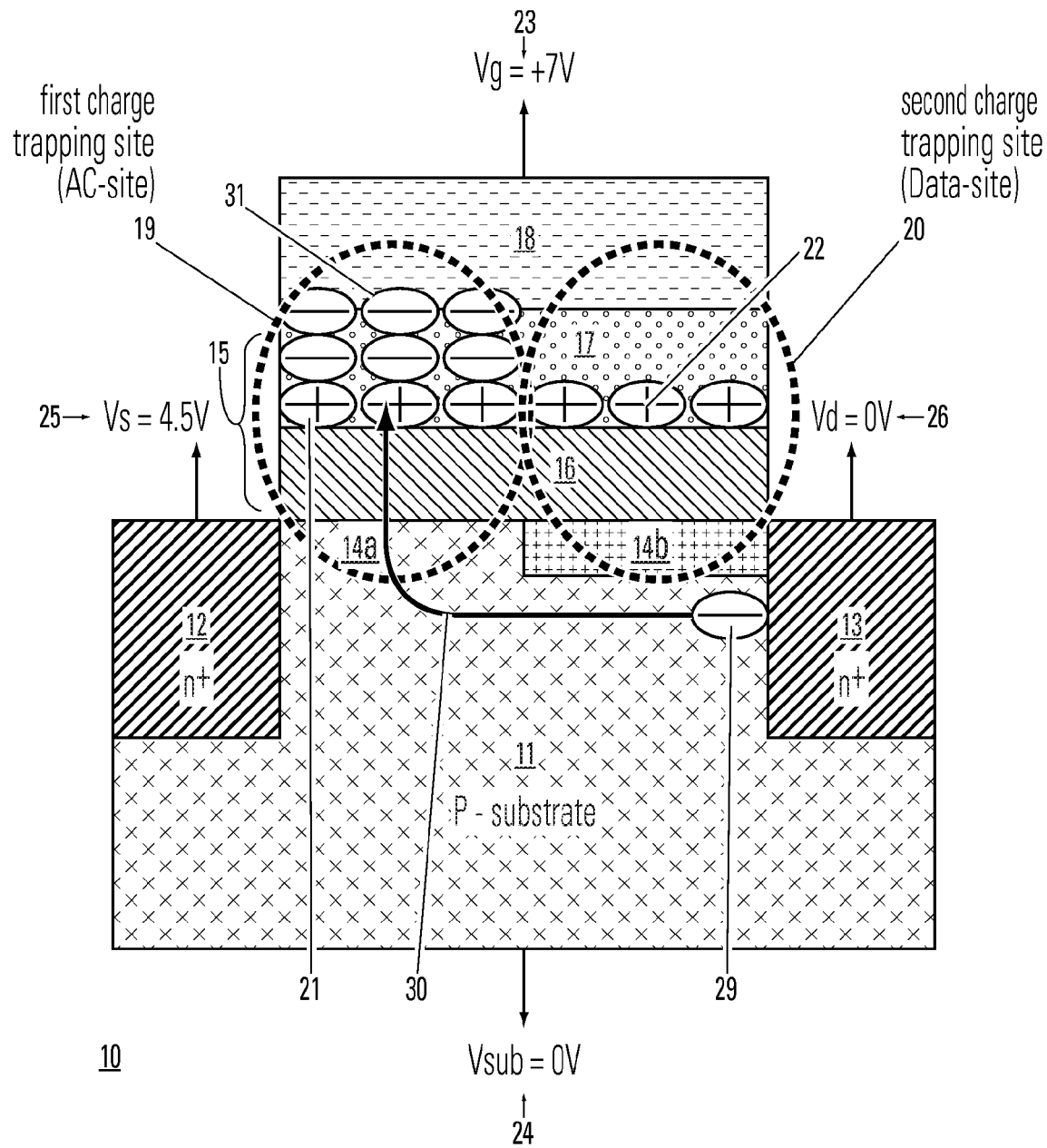
FIG. 2 is a process diagram illustrating a cross-sectional view of a charge trapping memory cell with a program operation using a channel hot electron method on the AC-site of the charge trapping memory cell in accordance with the present invention.

FIG. 2 is a process diagram illustrating a cross-sectional view of a charge trapping memory cell being programmed using a channel hot electron method on the AC-site of the charge trapping memory cell 10. The first charge trapping site 19 is permanently charged (permanently programmed) to a high voltage threshold Vt state using a channel hot electron method. The second charge trapping site (data site) 20 is not programmed and remains at a negative voltage threshold level, $-V_t$. Exemplary values for conducting the channel hot electron method are to apply the gate voltage Vg 23 with 7 volts, the source voltage Vs 25 with 4.5 volts, the drain voltage Vd 26 with 0 volts, and the substrate voltage Vsub with 0 volts. The channel hot electron programming causes electrons 29 to move in an L-shape like direction as indicated by arrow 30 to the first charge trapping site 19, where electrons 31 are situated above holes 21.

The hole charge induced channel 14 extends the entire channel between the source region n+ 12 and the drain region n+ 13. The hole charge induced channel 14 can be viewed in two sections, a first channel section 14a beneath the first charge trapping site and a second channel section 14b beneath the second charge trapping site 20. After the channel hot electron programming of the first charge trapping site 19, the first channel section 14a is turned off because the first charge trapping site 19 has been programmed to a high voltage threshold Vt state. The second channel section 14b remains turned on because the second charge trapping site 20 was not programmed.

Figure 3:
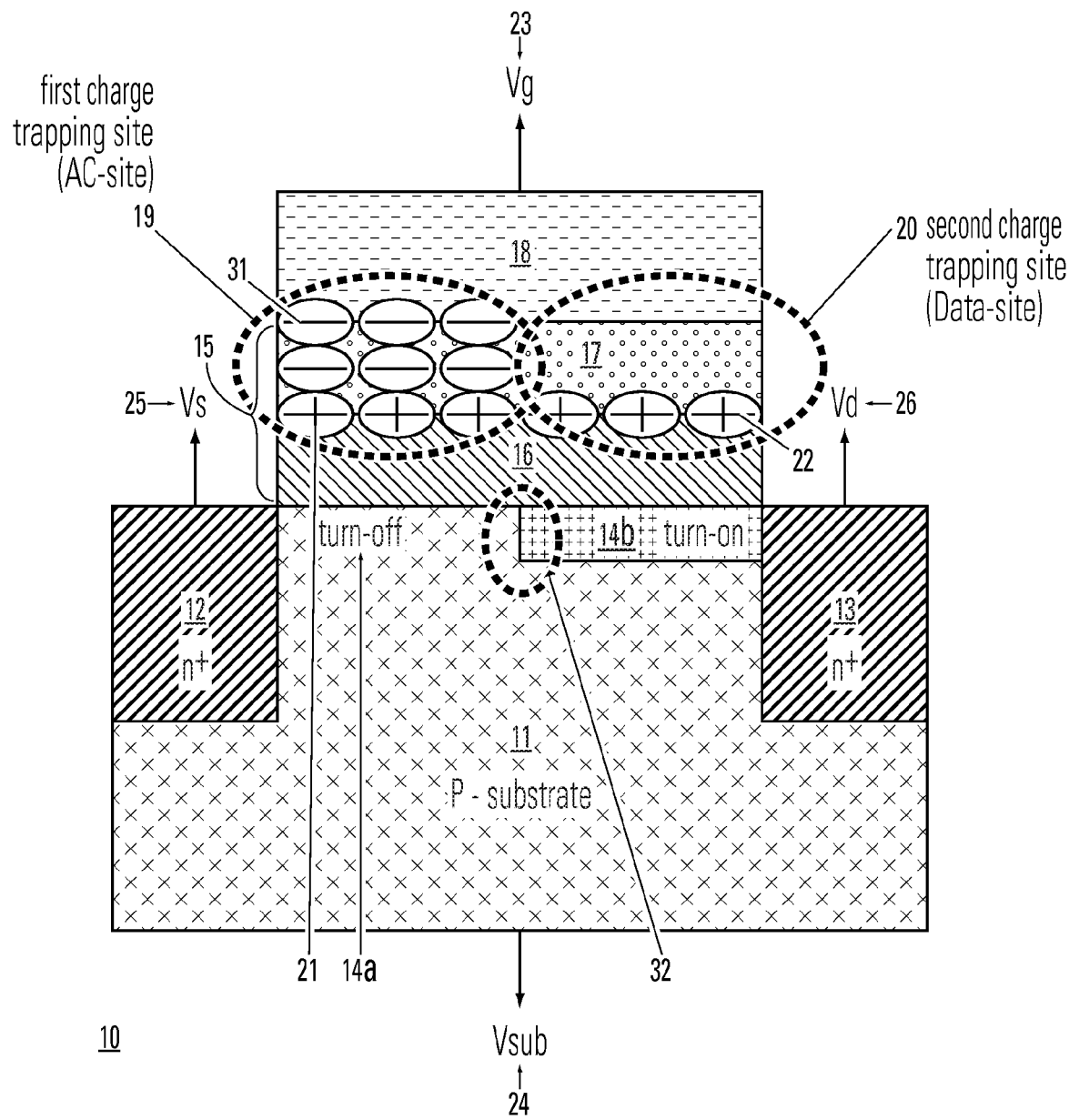
FIG. 3 is a process diagram illustrating a cross-sectional view of a charge trapping memory cell 100 in a turn-on-mode assist-charge (TOM-AC) structure after the erase operation and the permanent programming operation in accordance with the present invention.

FIG. 3 is a process diagram illustrating a cross-sectional view of a charge trapping memory cell 100 in a turn-on-mode assist-charge (TOM-AC) structure after the erase operation in FIG. 1 and the permanent programming operation in FIG. 2. The first charge trapping site 19 is permanently charged to a high voltage threshold state (high-Vt) after the channel hot electron programming. The second charge trapping site 20 remains in a low or negative voltage threshold state (low-Vt or negative-Vt) because no programming was conducted on the second charge trapping site 20. The combination of programming the first charge trapping site 19 to a high voltage threshold state and not programming the second charge trapping site 20 causes a voltage differential between the first charge trapping site 19 and the second charge trapping site 20. The voltage differential between the first charge trapping site 19 and the second charge trapping site 20 creates an abrupt electrical field region 32 between the first channel section 14a, which is turned off, and the second channel section 14b, which is turned on. In one embodiment, there is a substantial abrupt electrical field region present between the first channel section 14a and the second channel section 14b. Therefore, the first charge trapping site (AC-site) 19 is permanently charged so that the first charge trapping site 10 maintains the charge level state. The second charge trapping site (data site) 20 is used to store information or data by subsequent program and erase operations as described with respect to FIGS. 4 and 5.

Figure 4:
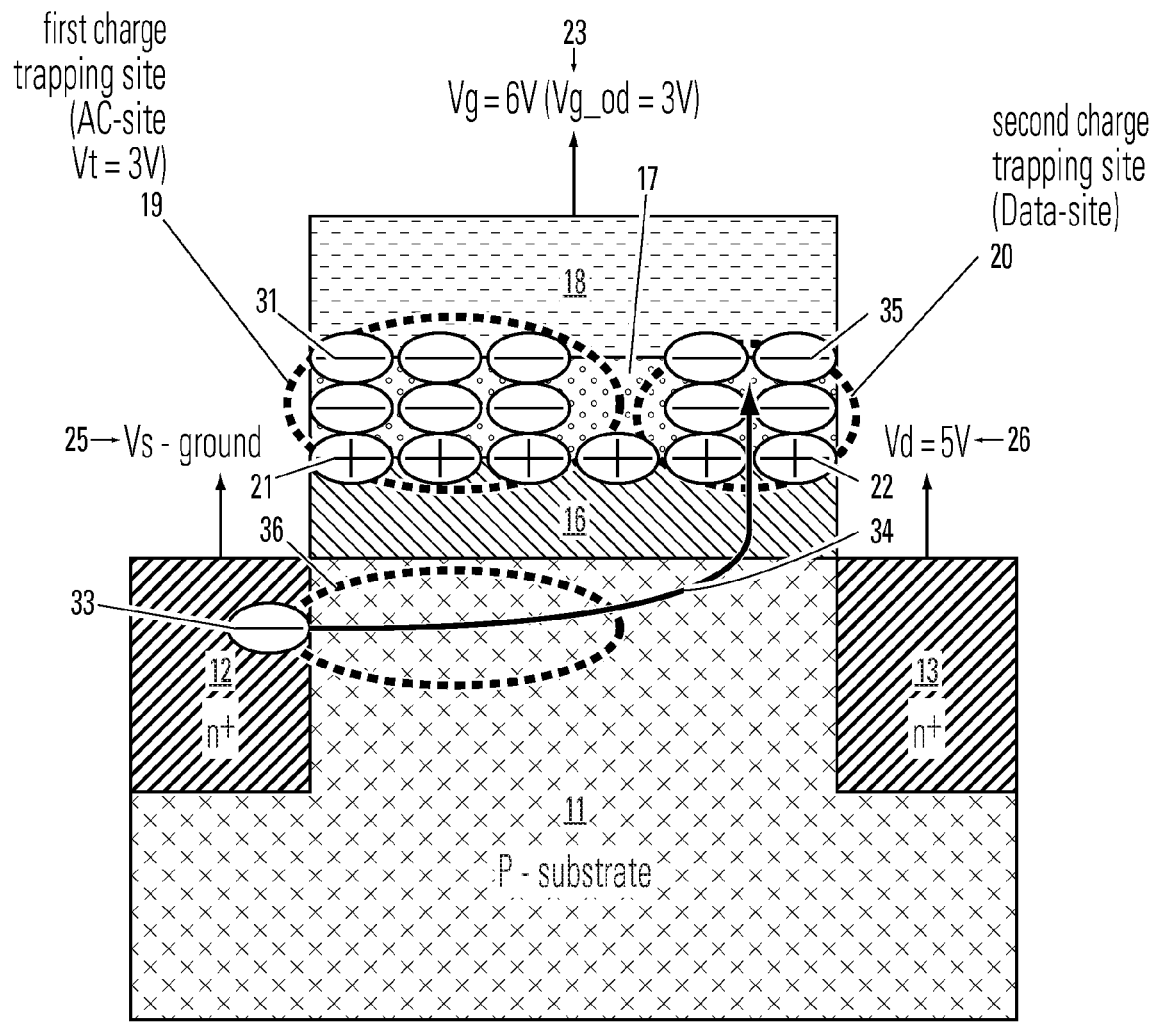
FIG. 4 is a process diagram illustrating conducting a program operation of the charge trapping memory cell using a hot electron programming method in accordance with the present invention.

FIG. 4 is a process diagram illustrating programming the charge trapping memory cell 100 using a hot electron programming method. Suitable hot electron programming techniques of the charge trapping memory cell 100 include channel hot electron (CHE) programming or source side injection (SSI) programming. Band-to-band tunneling induced hot hole injection would be a suitable erasing technique for the charge trapping memory cell 100. The hot electron programming of the charge trapping memory cell 100 causes electrons 33 to move in a direction, as indicated by arrow 36, to the data site 20 where electrons 35 are situated above holes 22.

The gate voltage 23 of 6 volts is applied to the polygate layer 18. Because the first charge trapping site (AC-site) 19 has already been permanently programmed to a high voltage threshold state, the effective gate voltage is denoted by a symbol $V_{g\_od}$, represented mathematically as $V_{g\_od} = V_g - V_t(AC\text{-site})$. In this instance, the high threshold voltage Vt of the first charge trapping site is set to 3 volts. The gate overdrive voltage $V_{g\_od}$ is computed to be 3 volts, $V_{g\_od} = 6$ volts $(V_g) - 3$ volts (Vt of AC-site). The same or substantially the same value between the $V_{g\_od}$ and the Vt (of the AC-site) limits the amount of program current on the AC-site. In this example, the Vg_od has the same value as Vt, which is 3 volts. When the parameter Vg_od is the same or substantially the same as the Vt of the AC-site, the channel section 14*a* on the AC-site 19 is not turned on and remains in a turned-off state.

The programming operation of the charge trapping memory cell 100 in this example involves the gate voltage 23 being applied with about 6 volts, the source voltage 25 being connected to ground, and the drain voltage 26 being applied with about 5 volts.

Figure 5:
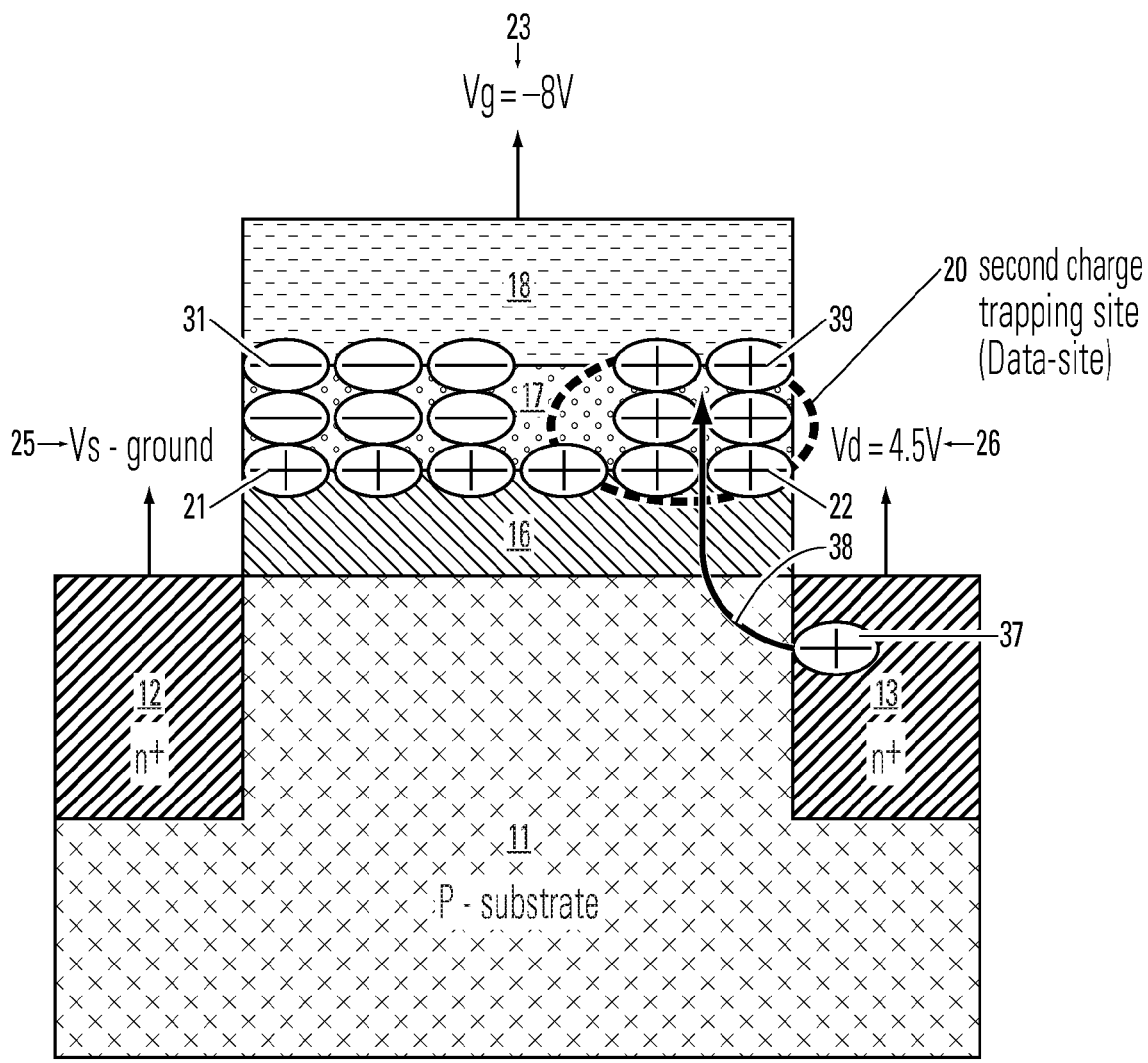
FIG. 5 is a process diagram illustrating conducting an erase operation of the charge trapping memory cell 100 using band-to-band tunneling induced hot hole injection in accordance with the present invention.

FIG. 5 is a process diagram illustrating an erase operation of the charge trapping memory cell 10 using band-to-band tunneling induced hot hole injection. The erase operation of the charge trapping cell 10 causes holes 37 to move in a direction, as shown by arrow 38, to inject holes 39 onto existing holes 22 in the second charge trapping site 22 in the charge trapping layer 17. Exemplary values for conducting an erase operation involve applying the gate voltage 23 with a negative voltage value of −8 volts, connecting the source voltage 25 to ground, and applying the drain voltage 26 with 4.5 volts.

Figure 6A:
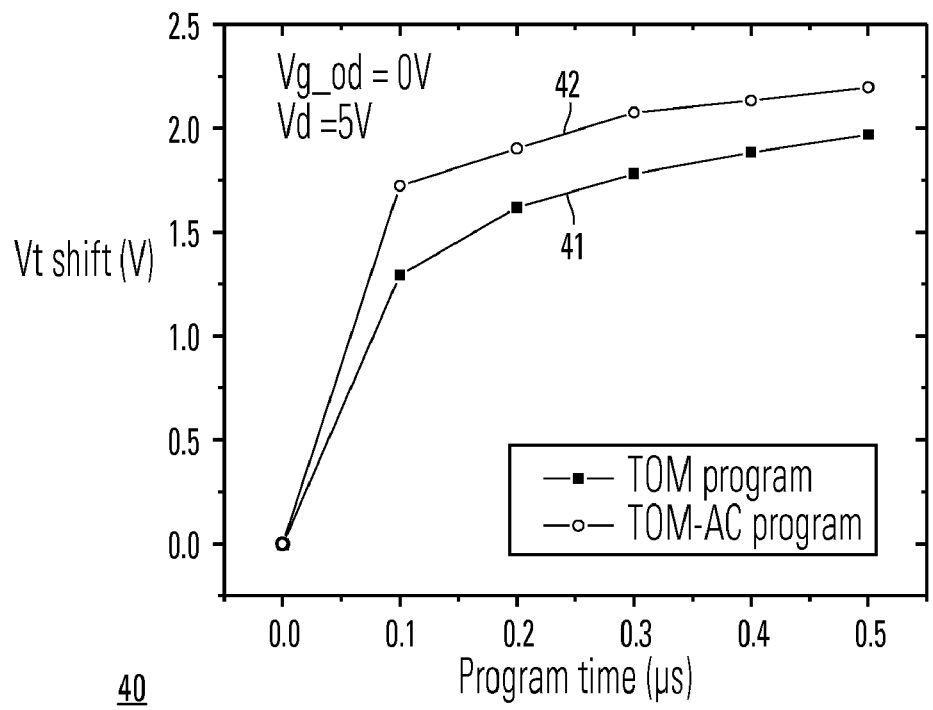
FIG. 6A is a graphical diagram illustrating sample curves of experimental data comparing the programming efficiency of a turn-on-mode memory structure and a turn-on-mode assist charge memory structure in accordance with the present invention.

FIG. 6A is a graphical diagram 40 illustrating sample curves 41, 42 of experimental data comparing the programming efficiency of a turn-on-mode memory structure and a turn-on-mode assist charge memory structure. The graph 40 shows two sample curves 41, 42 wherein the first sample curve 41 plots sample data points of a conventional turn-on-mode memory structure, and the second sample curve 42 plots sample data points of the turn-on-mode assist-charge memory structure of the present technology. In the graph 40, the x-axis represents the duration of a program time in microseconds and the y-axis represents the level of a threshold voltage. With the turn-on-mode assist-charge memory structure, the curve 42 illustrates that it takes less programming time to program the charge trapping memory cell 10 than the method used for curve 41. The programming time in the curve 41 is slower and lags behind the curve 42 in the programming speed. In this example, the gate over-drive voltage Vg_od is 0 volts and the drain voltage Vd is applied with 5 volts. Therefore, the curve 42 shows a faster programming efficiency for TOM-AC operations in comparison to the curve 41 of the TOM operations.

Figure 6B:
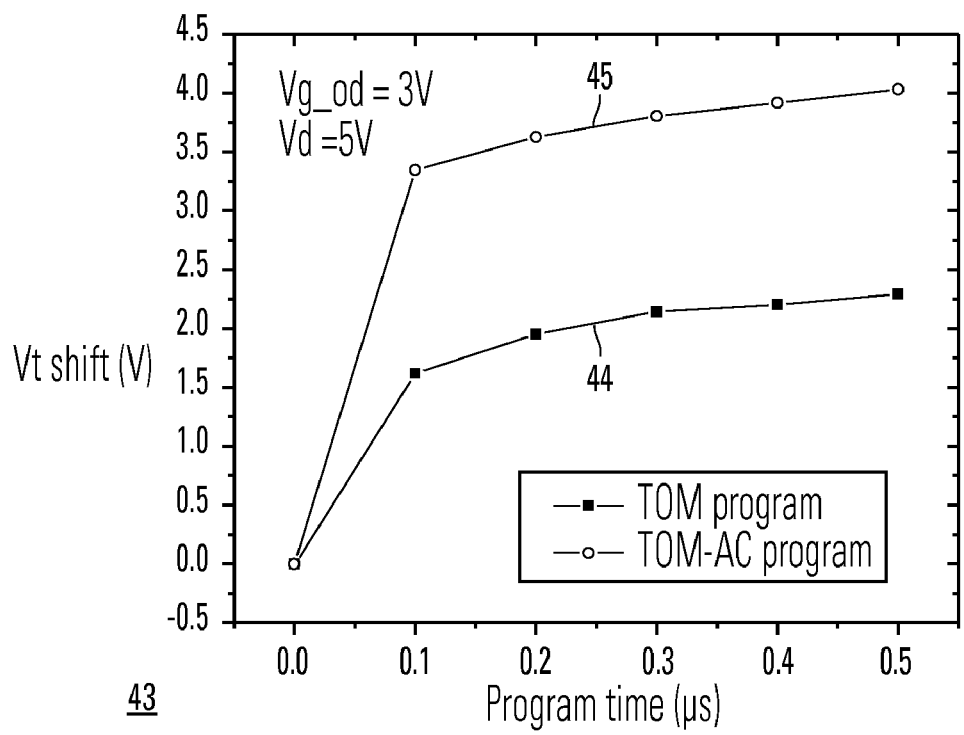
FIG. 6B is a graphical diagram illustrating sample curves of experimental data comparing the programming efficiency of a turn-on-mode memory structure and a turn-on-mode assist charge memory structure with a higher gate over-drive voltage in accordance with the present invention.

FIG. 6B is a graphical diagram 43 illustrating sample curves 44, 45 of experimental data comparing the programming efficiency of a turn-on-mode memory structure and a turn-on-mode assist charge memory structure with a higher gate over-drive voltage. The gate over-drive voltage Vg_od in this example is applied with 3 volts, which is higher than the gate over-drive voltage of 0 volts in FIG. 6A. The effect of a larger gate over-drive voltage is further enhanced program efficiency. The graph 43 shows a first curve 44 plotting sample data points of the turn-on-mode memory structure and a second curve 45 plotting sample data points of the turn-on-mode assist-charge memory structure of the present technology. The larger gate over-drive voltage Vg_od of 3 volts increases the program efficiency as evidenced by a faster program time and a greater differential between the first curve 44 from the TOM memory structure and the second curve 45 from the TOM-AC memory structure.

Figure 7A:
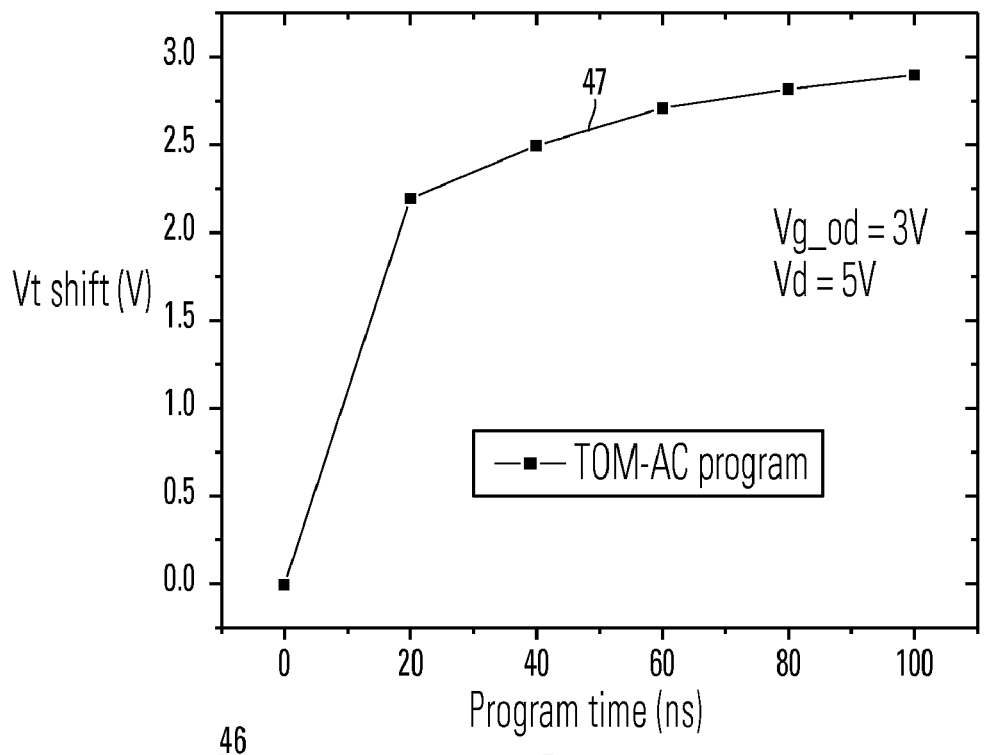
FIG. 7A is a graphical diagram illustrating a sample curve of experimental data representing programming speed of the turn-on-mode assist-charge memory structure in accordance with the present invention.

FIG. 7A is a graphical diagram 46 illustrating a sample curve 47 of experimental data representing the programming speed of the turn-on-mode assist-charge memory structure. Sample data points of the TOM-AC memory structure are plotted in the curve 47 with the gate over-drive voltage Vg_od set to 3 volts and the drain voltage Vd set to 5 volts. A fast programming speed of 20 ns or less can be achieved with the TOM-AC memory structure.

Figure 7B:
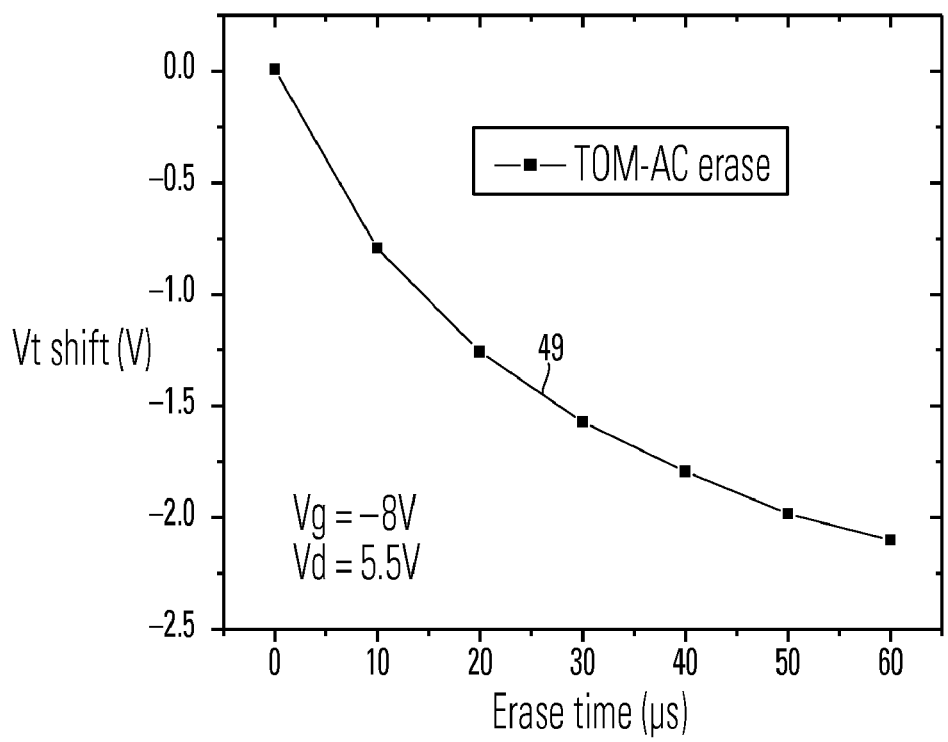
FIG. 7B is a graphical diagram illustrating a sample curve of experimental data representing erase speed of the turn-on-mode assist-charge memory structure in accordance with the present invention.

FIG. 7B is a graphical diagram 48 illustrating a sample curve 49 of experimental data representing the erasing speed of the turn-on-mode assist-charge memory structure. Sample data points of the TOM-AC memory structure are plotted in the curve 49 with the gate voltage set to 8 volts and the drain voltage Vd set to 5.5 volts. A fast erasing speed of 50 µs or less can be achieved with the TOM-AC memory structure.

The invention has been described with reference to specific exemplary embodiments. Accordingly, the specification and drawings are to be regarded as illustrative of the principles of this invention rather than restrictive; the invention is defined by the following appended claims.

I claim:

1. A method for programming a charge trapping memory having a plurality of charge trapping memory cells, each memory cell having a first charge trapping site, a second charge trapping site, a source region and a drain region, comprising:
    erasing the first charge trapping site and the second charge trapping site in each charge trapping memory cell to a negative voltage threshold level by FN injection; and
    programming the first charge trapping site to a high voltage threshold level with permanent charges in each charge trapping memory cell, the second charge trapping site in each charge trapping memory cell remaining in the negative voltage threshold level;
    wherein the first charge trapping site in each charge trapping memory cell is not available for storing information and the second charge trapping site in each charge trapping memory cell is available for storing information.

2. The method of claim 1, wherein the high voltage threshold level in the first charge trapping site and the negative voltage threshold level in the second charge trapping site creates an abrupt electrical field region between a first channel section adjacent to the source region and a second channel section adjacent to the drain region.

3. The method of claim 1, wherein the first charge trapping site in each charge trapping memory cell stores permanent charges for enhancing the programming speed for programming the second charge trapping site in each charge trapping memory cell.

4. The method of claim 1, after the programming step, further comprising programming each charge trapping memory cell by hot electron programming.

5. The method of claim 4, further comprising erasing each charge trapping memory cell by an erase process.

6. The method of claim 4, wherein the hot electron programming comprises channel hot electron programming.

7. The method of claim 4, wherein the hot electron programming comprising source side injection programming.

8. The method of claim 5, wherein the erasing process comprises band-to-band tunneling induced hot hole injection.

9. A memory structure, comprising:
    a charge trapping structure having a first charge trapping site and a second charge trapping site; and
    a substrate body underlying the charge trapping structure, having a source region spaced apart from a drain region, a hole charge induced channel disposed between the source and drain regions, the hole charge induced channel including a first channel section disposed adjacent to the source region and a second channel section disposed adjacent to the drain region, the first charge trapping site located adjacent to the source region, the second charge trapping site located adjacent to the drain region;
    wherein the charge trapping structure is erased to a negative threshold voltage level to turn on the first channel section and the second channel section, the first charge trapping site being programmed with permanent charges to turn off the first channel section.

10. The memory structure of claim 9, wherein the charge trapping structure comprising a charge trapping layer overlying a dielectric layer.

11. The memory structure of claim 9, wherein the charge trapping structure comprising a nitride layer overlying an oxide layer.

12. The memory structure of claim 9, wherein the charge trapping structure comprises a first dielectric layer overlying a charge trapping layer, and the charge trapping layer overlying a dielectric layer.

13. The memory structure of claim 9, wherein the charge trapping structure comprises a first oxide layer overlying a nitride layer, and the nitride layer overlying a second oxide layer.

14. The memory structure of claim 9, wherein the charge trapping structure comprises a dielectric layer overlying a charge trapping layer.

15. The memory structure of claim 9, wherein the charge trapping structure comprising an oxide layer overlying a nitride layer.

16. The memory structure of claim 9, further comprising a polygate overlying the charge trapping structure.

17. The memory structure of claim 9, wherein the erasing of the charge trapping cell comprises a FN tunneling operation.

18. The memory structure of claim 9, wherein the programming of the first charge trapping site of the charge trapping memory cell comprises a channel hot electron program.

19. The memory structure of claim 9, wherein the memory structure is programmed with information programmed to the second charge trapping site using hot electron programming.

20. The memory device of claim 19, wherein the memory device is erased by band-to-band tunneling induced hot hole injection.

21. The memory device of claim 9, wherein the first charge trapping site being programmed to a high voltage threshold level with permanent charges to turn off the first channel section.

22. The memory device of claim 21, wherein the first charge trapping site being programmed to the high voltage threshold level with permanent charges to a high voltage threshold state to turn off the first channel section.

23. The memory device of claim 9, wherein the first charge trapping site being programmed with permanent charges to a high voltage threshold state to turn off the first channel section.

* * * * *